United States Patent
Pastorino

(10) Patent No.: US 7,222,489 B2
(45) Date of Patent: May 29, 2007

(54) INTEGRATED THERMOELECTRIC MODULE

(75) Inventor: Giorgio Pastorino, Malgrate (IT)

(73) Assignee: Peltech S.r.l., Calolziocorte (Lecco) (IT)

( * ) Notice: Subject to any disclaimer, the term of this patent is extended or adjusted under 35 U.S.C. 154(b) by 84 days.

(21) Appl. No.: 10/527,845

(22) PCT Filed: Nov. 27, 2003

(86) PCT No.: PCT/IT03/00784

§ 371 (c)(1),
(2), (4) Date: Mar. 15, 2005

(87) PCT Pub. No.: WO2004/051158

PCT Pub. Date: Jun. 17, 2004

(65) Prior Publication Data

US 2005/0279105 A1    Dec. 22, 2005

(30) Foreign Application Priority Data

Dec. 2, 2002  (IT) .......................... MI2002A2548

(51) Int. Cl.
*F25B 21/02*    (2006.01)
(52) U.S. Cl. ......................................... 62/3.7; 62/259.2
(58) Field of Classification Search ................... 62/3.2, 62/3.3, 3.7, 259.2
See application file for complete search history.

(56) References Cited

U.S. PATENT DOCUMENTS 3,870,568 A * 3/1975 Oesterhelt et al. .......... 136/212

* cited by examiner

*Primary Examiner*—Melvin Jones
*Assistant Examiner*—T. Harrell
(74) *Attorney, Agent, or Firm*—Wenderoth, Lind & Ponack, L.L.P.

(57) ABSTRACT

An integrated thermoelectric module is formed of a set of thermoelectric elements, consisting of N type and P type conductor and/or semiconductor elements electrically connected in series and thermally connected in parallel, the thermoelectric elements being electrically connected in series and/or in parallel and thermally connected in parallel and being assembled on flexible supports of polymeric material, capable of electrically isolating said circuit, but having a high thermal conductivity efficiency. Each support is connected to a heat exchanger by means of connection materials having low thermal impedance allowing optimum connection even at low adhesion pressures. The thermoelectric elements are distributed in its interior part so as to geometrically harmonize heat transferred from the integrated thermoelectric module with heat exchanged by the heat exchangers, thus making the temperature distribution on said heat exchangers as uniform as possible, in order to maximize the efficiency of the integrated thermoelectric module.

17 Claims, 3 Drawing Sheets

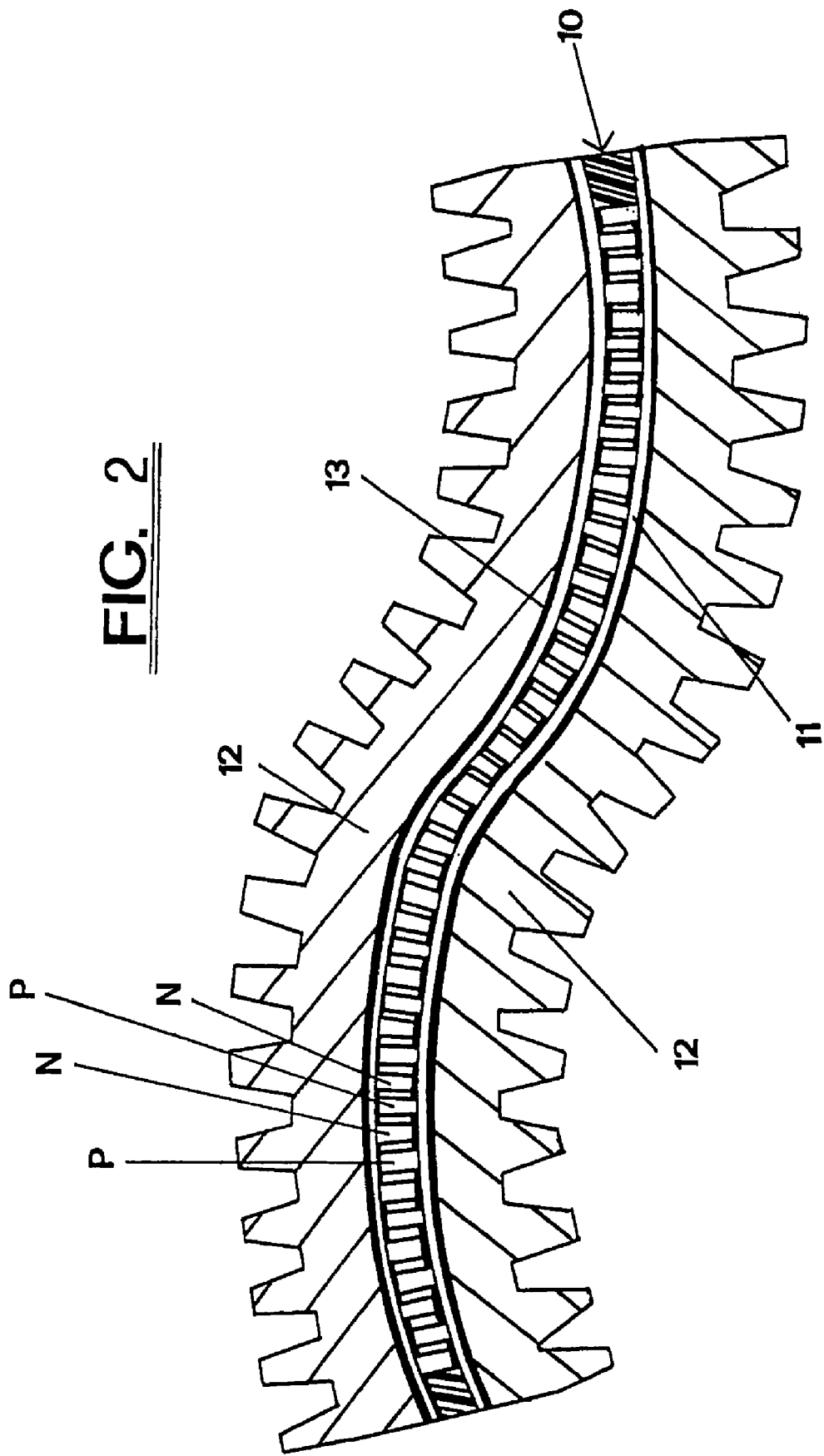

INTEGRATED THERMOELECTRIC MODULE

TECHNICAL FIELD

The present invention generally refers to the field of solid-state thermoelectric devices using the Peltier effect to cool and/or heat civil and/or industrial environments.

PRIOR ART

The thermoelectric devices of the abovementioned type have been known in the art for quite some time and generally comprise a thermoelectric module or thermopile consisting of a set of thermoelectric elements which, in their turn, are formed by P type and N type conductor and/or semiconductor elements electrically connected in series and thermally connected in parallel, wherein the thermoelectric elements are usually electrically connected in series and thermally connected in parallel and are assembled on supports made of electrically insulating, but thermally conductive, material and generally made of stiff ceramic material. These thermoelectric modules must then be connected to heat exchangers in order to form heat pumps for household and industrial appliances.

The thermoelectric modules known in the art generally present some drawbacks related to their thermal efficiency and fragility. As to the first of these drawbacks, in particular, the thermoelectric modules known in the art are not able to achieve a uniform temperature distribution on the heat exchangers to which they are connected, because they cannot be adapted to the variable characteristics of the heat exchangers depending on the type of application they are intended for. As to the second drawback, it is known that, because of the fragility of the support, during the assembly steps with the heat exchangers ruptures frequently occur due to the high contact pressures required for good functioning and/or during operation due to the different thermal expansions of the two faces of the module, caused by the different temperatures of the heat exchangers they are connected to.

SUMMARY OF THE INVENTION

The present invention pursues the object to overcome the above-mentioned drawbacks of the thermoelectric modules known in the art by providing a newly designed thermoelectric module that is to be assembled and integrated with heat exchangers in order to form a thermoelectric heat pump.

According to the present invention, this object is achieved by an integrated thermoelectric module formed of a set of thermoelectric elements, each of which is made of P type and N type conductor and/or semiconductor elements electrically connected in series and thermally connected in parallel, wherein the thermoelectric elements are electrically connected in series and/or in parallel and thermally connected in parallel and are assembled on flexible supports made of a polymeric material capable of electrically insulating the circuit, but having a high thermal conductivity performance. These supports, one being on the hot side and the other on the cold side of the thermoelectric module, are connected to their respective heat exchangers by means of connecting materials having low thermal impedance, for instance of phase conversion type or graphite-base type, allowing optimum connection even at low adhesion pressures. The integrated module is characterized in that the thermoelectric elements are distributed in its interior so as to geometrically harmonize heat transferred from the integrated thermoelectric module with heat exchanged by the heat exchangers, thus making the temperature distribution on the heat exchangers as uniform as possible, in order to maximize the efficiency of the integrated thermoelectric module by reducing the thermal head between its two faces.

BRIEF DESCRIPTION OF THE DRAWINGS

The present invention will now be described as a non-limiting example with reference to the figures of the accompanying drawings, in which:

FIG. 2 is a sectional view of the integrated thermoelectric module according to the invention, associated with heat exchangers of concave and/or convex form in order to form a thermoelectric heat pump;

DETAILED DESCRIPTION OF THE INVENTION

Figure 1:
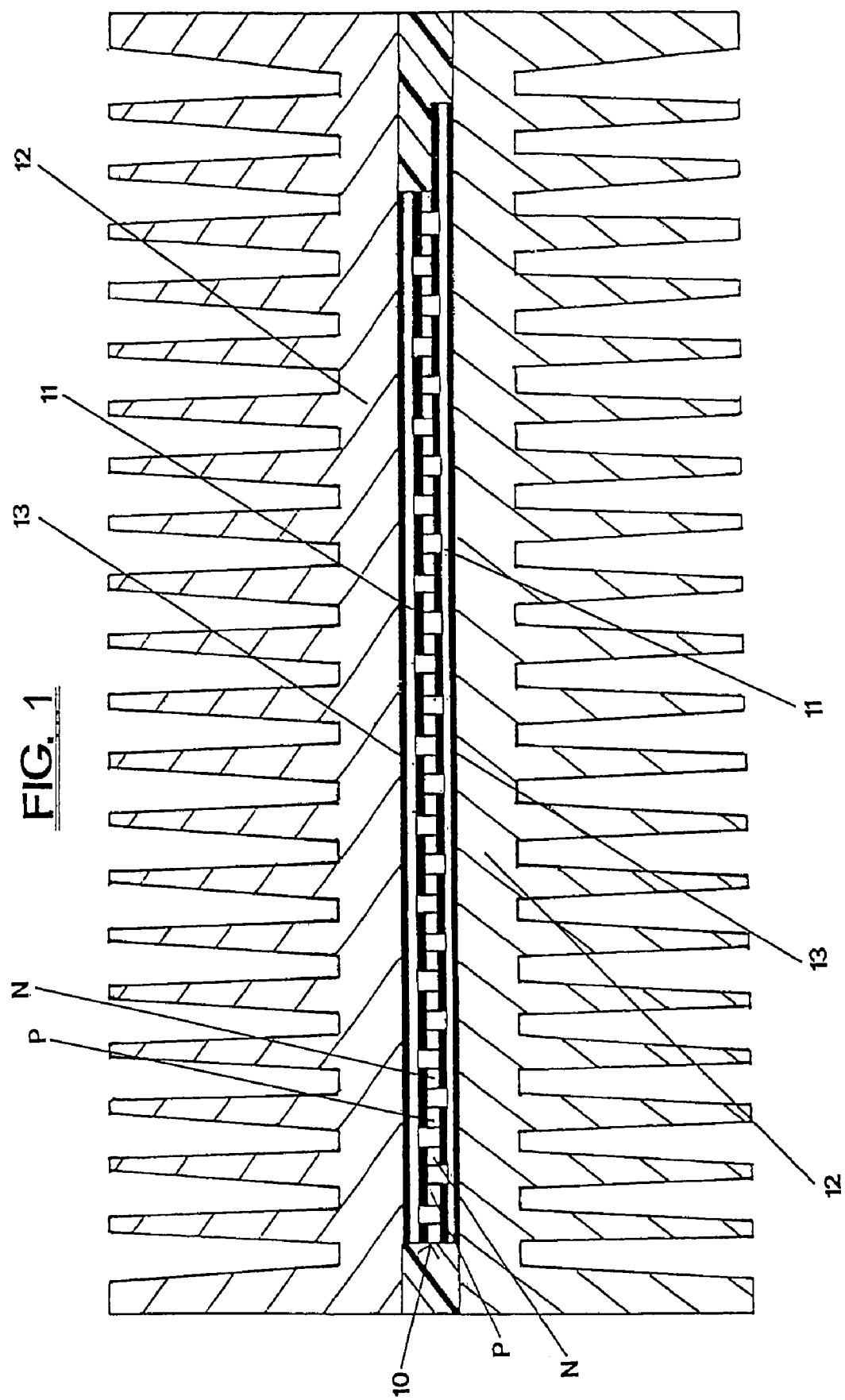
FIG. 1 is a sectional view of the integrated thermoelectric module according to the invention, associated with heat exchangers of planar form in order to form a thermoelectric heat pump.

Referring to FIG. 1 of the drawings, the integrated thermoelectric module 10 is formed of a set of thermoelectric elements, as described above, assembled on flexible supports 11 having the form of a thin membrane or film of polymeric material. The thermoelectric elements are uniformly or non-uniformly distributed on the flexible support 11 depending on the particular use the thermoelectric module 10 is intended for.

The peripheral shape of the integrated thermoelectric module may be different and may be rectangular, for instance even square, or curvilinear, for instance circular.

The polymeric material of the flexible support 11 is preferably made of a polyimide, commercially available under the trade name Kapton®.

The integrated thermoelectric module 10, thus formed, is associated with heat exchangers 12 and is caused to adhere to the base surfaces of the latter, preferably by means of a thermo conductive material 13 of phase conversion type. Instead of the thermo conductive material of phase conversion type, a graphite material may be used as connecting material, laid on one side only or on both sides of the integrated thermoelectric module 10.

Figure 4:
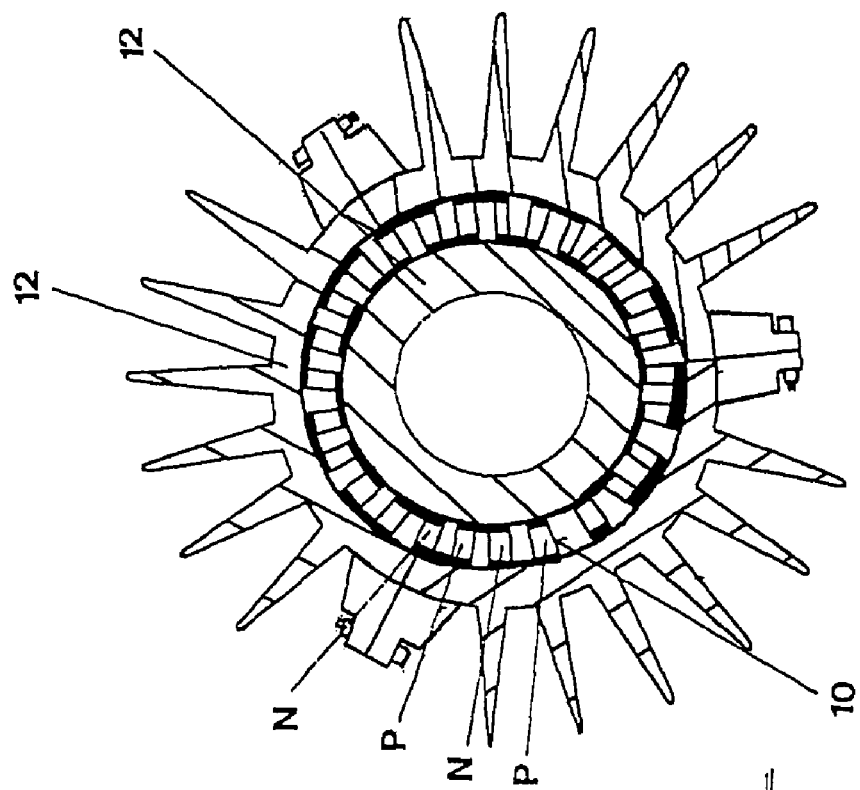
FIG. 4 is a sectional view of the integrated thermoelectric module according to the invention, associated with heat exchangers of cylindrical form with circular cross section in order to form a thermoelectric heat pump.
Figure 3:
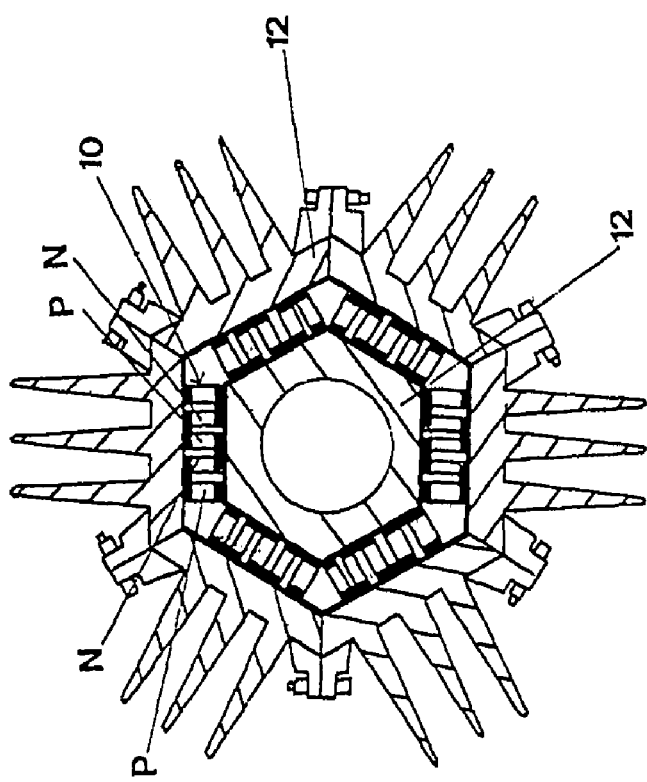
FIG. 3 is a sectional view of the integrated thermoelectric module according to the invention, associated with heat exchangers of cylindrical form with a polygonal cross section in order to form a thermoelectric heat pump.

The base surfaces of the heat exchangers may be planar, as shown in FIG. 1, or concave and/or convex, as shown in FIG. 2, or cylindrical with a polygonal cross section, as shown in FIG. 3, or cylindrical with circular cross section, as shown in FIG. 4. Heat exchangers 12 may be touched by gaseous or liquid fluids as well as by fluids undergoing phase conversion. In addition, the surfaces being touched may be provided with fins. The heat exchangers 12 may be made of metal or non-metal material. For instance, as non-metal material, a graphite material may be used.

The connecting materials used to connect the integrated thermoelectric module 10 to the heat exchangers 12 may be either distributed in a substantially uniform way on the flexible support 11 or they may be localized on the flexible support 11 in correspondence with the thermoelectric elements.

The technical advantages achieved with a thermoelectric device according to the invention are as follows.

With a proper distribution of the thermoelectric elements inside the integrated thermoelectric module 10, it is possible to harmonize the configuration of the module with that of the heat exchangers 12 in order to improve the correspondence between heat transferred from the module and heat exchanged by the heat exchangers 12 and to achieve a temperature distribution as uniform as possible, thus improving efficiency of the integrated thermoelectric module 10 with reduction of the thermal head between its two faces.

INDUSTRIAL APPLICABILITY

The use of a connecting material between integrated thermoelectric module 10 and heat exchangers 12, as described, permits to obtain a stable connection even in the absence of an excessive contact pressure in order to achieve close contact between the integrated thermoelectric module and heat exchangers. In addition, the connecting materials have high thermal conductivity and are capable of absorbing, in the best possible manner and without damage to the module itself, possible thickness irregularities of the module due to different height of the thermoelectric elements and differential effects in terms of thermal expansion of the heat exchangers, when, during operation, they find themselves at mutually different temperatures. Finally, if heat exchangers are used having non-planar adhesion surfaces, the connecting materials could be used to offset non-conformity of the planar base of the thermoelectric elements with the curvature of the exchanger base, by filling up the interstices that are present between flexible support 11 and surface of heat exchangers 12.

The invention claimed is:

1. An integrated thermoelectric module comprising:
   a set of thermoelectric elements, each of which is made of P type and N type conductor and/or semiconductor elements electrically connected in series and thermally connected in parallel,
   wherein said thermoelectric elements are electrically connected in series and/or in parallel and thermally connected in parallel, and are assembled on flexible supports made of a polymeric material, the flexible supports being connected to respective heat exchangers,
   wherein said thermoelectric elements are distributed in the interior of said integrated thermoelectric module so as to geometrically harmonize heat transferred from said integrated thermoelectric module with heat exchanged by the heat exchangers, thus making the temperature distribution on the heat exchangers as uniform as possible, in order to maximize the efficiency of said integrated thermoelectric module by reducing a thermal head between its two opposite faces.

2. The intergrated thermoelectric module according to claim 1, wherein, in order to connect said intergrated thermoelectric module to the heat exchange, a thermally conductive material of phase conversion type is used having high thermal conductivity and which is capable of absorbing, without damage to said intergrated thermoelectric module, possible irregularities of the thickness of said intergrated thermoelectric module due to height tolerances of said thermoelectric elements.

3. The intergrated thermoelectric module according to claim 1, wherein, in order to connect said intergrated thermoelectric module to the heat exchangers, a thermally conductive graphite material is used, laid either on one face only or on both faces of said intergrated thermoelectric module.

4. The intergrated thermoelectric module according to claim 1, wherein a base of said intergrated thermoelectric module has a rectangular shape.

5. The intergrated thermoelectric module according to claim 1, wherein a base of said intergrated thermoelectric module has a curvilinear peripheral shape.

6. The intergrated thermoelectric module according to claim 1, wherein said thermoelectric elements are uniformly distributed inside said intergrated thermoelectric module.

7. The intergrated thermoelectric module according to claim 1, wherein said thermoelectric elements are non-uniformly distributed inside said intergrated thermoelectric module.

8. The intergrated thermoelectric module according to claim 1, wherein the heat exchangers have a planar connection surface.

9. The intergrated thermoelectric module according to claim 1, wherein the heat exchangers have a concave and/or convex connection surface.

10. The intergrated thermoelectric module according to claim 1, wherein the heat exchangers have a cylindrical shape with a polygon cross section.

11. The intergrated thermoelectric module according to claim 1, wherein the heat exchangers have a cylindrical shape with a circular cross section.

12. The intergrated thermoelectric module according to claim 1, wherein the heat exchangers are finned.

13. The intergrated thermoelectric module according to claim 1, wherein the heat exchangers may touched by gaseous or liquid fluids as well as by fluids that are bound to phase conversion.

14. The intergrated thermoelectric module according to claim 1, wherein the heat exchangers may be touched by fluids bound to phase conversion.

15. The intergrated thermoelectric module according to claim 1, wherein the heat exchangers avail themselves of the latent heat of phase conversion of a fluid.

16. The intergrated thermoelectric module according to claim 4, wherein the rectangular shape comprises a square shape.

17. The intergrated thermoelectric module according to claim 5, wherein the curvilinear peripheral shape comprises a circular shape.

* * * * *